United States Patent
Lee et al.

(10) Patent No.: US 6,724,075 B2
(45) Date of Patent: *Apr. 20, 2004

(54) SEMICONDUCTOR CHIP PACKAGE AND MANUFACTURING METHOD THEREOF

(75) Inventors: Shih Chang Lee, Kaohsiung Hsien (TW); Chun Chi Lee, Kaohsiung (TW); Cheng Yin Lee, Tainan (TW)

(73) Assignee: Advanced Semiconductor Engineering, Inc., Kaoshiung (TW)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/966,067

(22) Filed: Oct. 1, 2001

(65) Prior Publication Data

US 2003/0030132 A1 Feb. 13, 2003

(51) Int. Cl.⁷ .......................... H01L 23/02; H01L 29/36
(52) U.S. Cl. ........................................ 257/678; 257/110
(58) Field of Search ........................... 257/678; 438/112

(56) References Cited

U.S. PATENT DOCUMENTS 5,900,676 A * 5/1999 Kweon et al. .............. 257/787
6,159,770 A * 12/2000 Tetaka et al. .............. 438/112

* cited by examiner

Primary Examiner—Amir Zarabian
Assistant Examiner—Kiesha Rose
(74) Attorney, Agent, or Firm—Lowe Hauptman Gilman & Berner LLP (57) ABSTRACT

A semiconductor chip package comprises a semiconductor chip with a metal layer formed over the backside surface thereof and a package body encapsulating the chip in a manner that the metal layer on the backside surface of the chip is exposed from the bottom surface of the package body. The package body has a plurality of protruding potions projecting from the bottom surface of the package body. A plurality of bonding wires each has one end electrically connected to the semiconductor chip and the other end exposed from one of the protruding portions of the package body for electrical coupling to an outside circuit. Preferably, the exposed end of each bonding wire has a longitudinal length at least four times larger than the diameter of the bonding wire. The present invention further provides manufacturing methods of the semiconductor chip package.

8 Claims, 9 Drawing Sheets

SEMICONDUCTOR CHIP PACKAGE AND MANUFACTURING METHOD THEREOF

BACKGROUND OF THE INVENTION

1. Field of the Invention

This invention generally relates to an electronic device, and more particularly to a semiconductor chip package and a manufacturing method thereof.

2. Description of the Related Art

Figure 1:
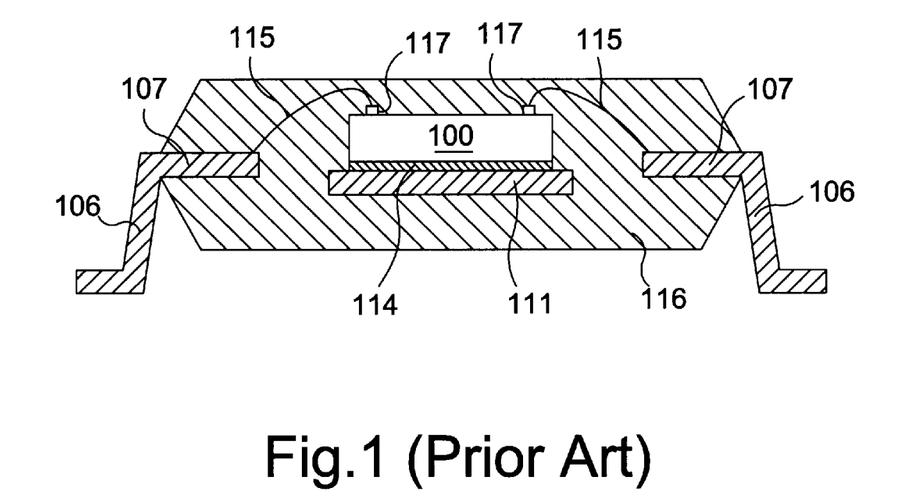
FIG. 1 is a cross sectional view of a conventional semiconductor chip package.

FIG. 1 depicts a conventional semiconductor chip package including a lead frame for supporting a semiconductor chip 100. The lead frame includes a plurality of leads having outer lead portions 106 and inner ends 107. The chip 100 is attached onto a die pad 111 by means of a silver paste 114. The die pad 111 is connected to the lead frame by several supporting bars (not shown in FIG. 1). The outer lead portions 106 are used for electrical coupling to an outside circuit. The chip 100 has bonding pads 117 electrically interconnected to the inner ends 107 of the lead frame though bonding wires 115. The chip 100, the die pad 111, the inner ends 107 of the lead frame and bonding wires 115 are encapsulated in a plastic package body 116 made of insulating material such as epoxy.

Because the plastic package body 116 completely surrounds the chip 100, the heat generated from the chip 100 during normal operation must pass through the package body 116 to outside. Due to the insulating properties of the package body 116, heat dissipation from the chip 100 is resisted, thereby creating, in some instances, high temperatures within the conventional package which might impair or damage the chip 100.

Figure 2:
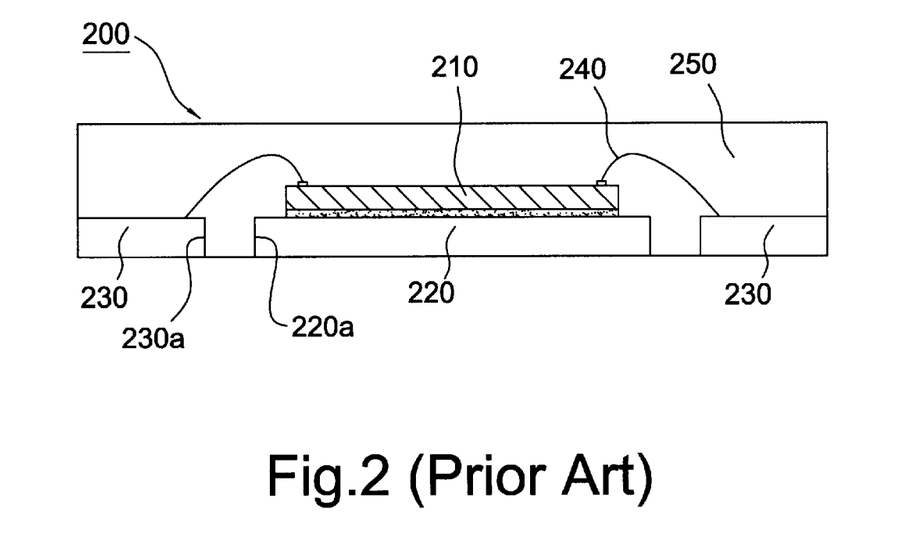
FIG. 2 is a cross sectional view of another conventional semiconductor chip package.

Therefore, the semiconductor industry develops a leadless semiconductor package 200 (as shown in FIG. 2) mainly comprising a chip 210 attached on a die pad 220 of a lead fame via an adhesive layer. The lead frame comprises a plurality of leads 230 electrically connected to the chip 210 through a plurality of bonding wires 240. The chip and the lead frame are enclosed in a package body 250 wherein the lower surface of the lead frame is exposed through the package body 250. Consequently, the heat generated from the semiconductor chip during normal operation can be directly transferred through the die pad 220 of the lead frame to outside thereby enhancing the thermal performance of the leadless semiconductor chip package 200.

However, since the lower surface of the lead frame is exposed through the package body, flash problems tend to occur at the edge 230a of the leads 230 and the edge 220a of the die pad 220. This may be fatal to the solder joint reliability of the leads 230 and adversely affect the thermal performance of the die pad 220. Furthermore, as IC device moves its endless pace toward lighter, thinner and smaller in size, the traditional packages described above cannot fully meet the requirement of low profile. Accordingly, there exists a need in the art of semiconductor packaging for a package structure capable of providing a further reduced profile.

SUMMARY OF THE INVENTION

It is a primary object of the present invention to provide a semiconductor chip package characterized by having a semiconductor chip with a metal layer formed over the backside surface thereof which is encapsulated in a package body such that the metal layer is exposed from the bottom of the package body, thereby acquiring a better thermal performance.

It is a secondary object of the present invention to provide a method for manufacturing a semiconductor chip package wherein the lead frame is skipped thereby significantly reducing the package profile.

To achieve the above listed and other objects, the present invention provides a semiconductor chip package comprising a semiconductor chip with a metal layer formed over the backside surface thereof and a package body encapsulating the chip in a manner that the metal layer on the backside surface of the chip is exposed from the bottom surface of the package body. The package body has a plurality of protruding potions projecting from the bottom surface of the package body. A plurality of bonding wires each has one end electrically connected to the semiconductor chip and the other end exposed from one of the protruding portions of the package body for electrical coupling to an outside circuit. Preferably, the exposed end of each bonding wire has a longitudinal length at least four times larger than the diameter of the bonding wire. It is noted that the metal layer on the backside surface of the chip is directly exposed from the bottom surface of the package body thereby enabling a better thermal dissipation so as to extend the chip's lifetime. Due to elimination of the conventional lead frame, the semiconductor chip package of the present invention features lower profile and light weight.

According to a first embodiment of the present invention, there is provided a method for manufacturing the semiconductor chip package comprising the steps of: (a) attaching a tape onto a rigid metal plate so as to form a tape/plate assembly; (b) attaching a semiconductor chip onto the tape/plate assembly through an adhesive layer on the upper surface of the tape wherein the tape has a plurality of holes formed at the peripheral of the semiconductor chip; (c) connecting a first ends of bonding wires to the semiconductor chip and a second ends of the bonding wires to the rigid metal plate through the holes of the tape; (d) encapsulating the semiconductor chip and the bonding wires against a portion of the tape/plate assembly with a package body; and (e) removing the rigid metal plate and the tape after the encapsulating step such that the second ends of the bonding wires are exposed from the package body.

According to a second embodiment of the present invention, there is provided a method for manufacturing the semiconductor chip package comprising the steps of: (a) attaching a tape onto a rigid metal plate so as to form a tape/plate assembly; (b) forming a metal flash on certain area of the rigid metal plate which is exposed from the holes of the tape; (c) attaching a semiconductor chip onto the tape/plate assembly wherein the tape has a plurality of holes formed at the peripheral of the semiconductor chip; (d) connecting a first ends of bonding wires to the semiconductor chip and a second ends of the bonding wires to the metal flash through the holes of the tape; (e) encapsulating the semiconductor chip and the bonding wires against a portion of the tape/plate assembly with a package body; and (f) removing the tape and the rigid metal plate including the metal flash after the encapsulating step such that the second ends of the bonding wires are exposed from the package body.

According to a third embodiment of the present invention, there is provided a method for manufacturing the semiconductor chip package comprising the steps of: (a) attaching a tape onto a nonmetal rigid plate so as to form a tape/plate assembly; (b) forming a metal flash on the surface of the tape/plate assembly by electroless plating; (c) attaching a semiconductor chip onto the metal flash on the tape/plate assembly; (d) connecting a first ends of bonding wires to the semiconductor chip and a second ends of the bonding wires to the metal flash on the nonmetal rigid plate through the holes of the tape; (e) encapsulating the semiconductor chip and the bonding wires against a portion of the tape/plate assembly with a package body; and (f) removing the tape and the nonmetal rigid plate including the metal flash after the encapsulating step such that the second ends of the bonding wires are exposed from the package body.

In the semiconductor chip packaging methods according to the present invention, the conventional lead frame is skipped thereby significantly reducing the finished package's profile.

DETAILED DESCRIPTION OF THE PREFERRED EMBODIMENT

Figure 3:
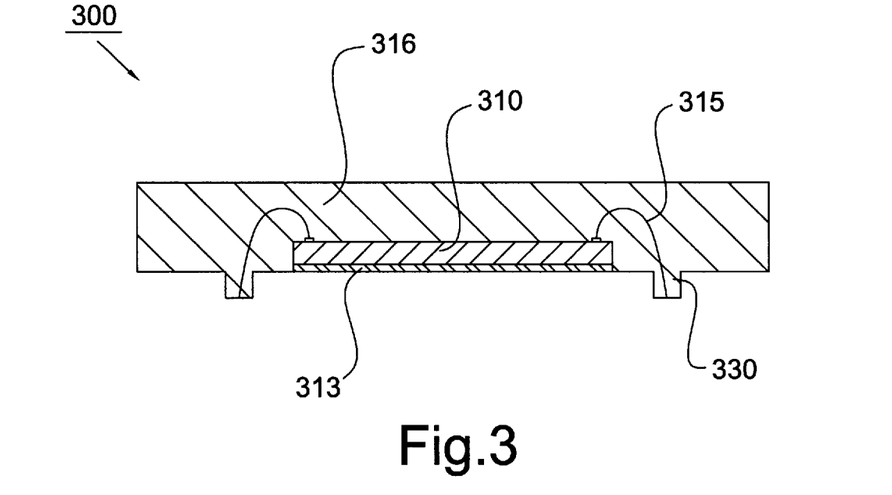
FIG. 3 is a cross sectional view of a semiconductor chip package according to a preferred embodiment of the present invention.
Figure 4:
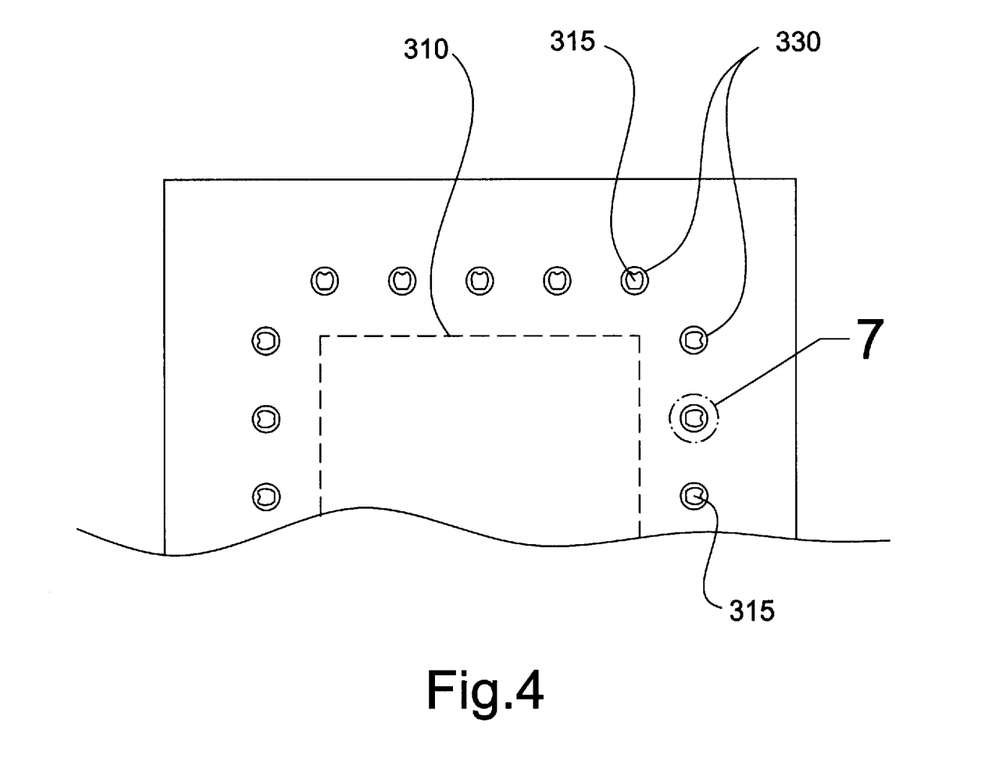
FIG. 4 is a bottom plan view of the semiconductor chip package of FIG. 3.

FIG. 3 and FIG. 4 illustrate a semiconductor chip package 300 according to the present invention. The package 300 mainly comprises a semiconductor chip 310 and a plurality of bonding wires 315 such as gold wires encapsulated in a package body 316. The package body has a plurality of protruding potions 330 projecting from the bottom surface of the package body. The bonding wires has one ends electrically connected to the semiconductor chip 310 and the other ends exposed from the protruding portions 330 of the package body (see FIG. 4) for making electrical coupling to an outside circuit. It is noted that the semiconductor chip 310 has a metal layer directly formed on the backside surface thereof. The metal layer 313 is directly exposed from the bottom surface of the package body 316 thereby significantly improving the thermal performance thereof. Preferred metals for use in forming the metal layer 313 of the present invention include aluminum, copper, gold, palladium and silver.

It could be understood that the metal layer 313 may be directly formed on the backside surface of a semiconductor wafer via conventional deposition methods such as sputtering, physical vapor deposition (PVD), chemical vapor deposition (CVD) or combination thereof It should be understood that the semiconductor wafer might subject to a backside-grinding operation to reduce the thickness thereof, and then the metal layer 313 is directly formed on the ground surface of the wafer. Specifically, when the metal layer is formed by sputtering, the backside surface of the semiconductor wafer is cleaned and then the wafer to be coated is placed adjacent to a cathode made of the substance which will form the metal layer. The cathode is subject to a high negative voltage and is placed in an inert gas atmosphere at low pressure. Under the influence of the high voltage potential difference, atmospheric ions are accelerated against the surface of the cathode wherein the momentum of the ions is transferred to atoms on the surface of the cathode, ejecting the atoms from the surface of the cathode and causing them to contact and adhere to the adjacent semiconductor wafer. Inert gases useful for such sputtering techniques include helium, neon, argon, krypton, xenon, nitrogen, etc. Finally, the coated semiconductor wafer is cut into individual semiconductor chips 310 each with a metal layer directly formed on the backside surface thereof.

FIGS. 5a–5d illustrate a method for manufacturing a semiconductor chip package according to a first preferred embodiment of the present invention.

Figure 5A:
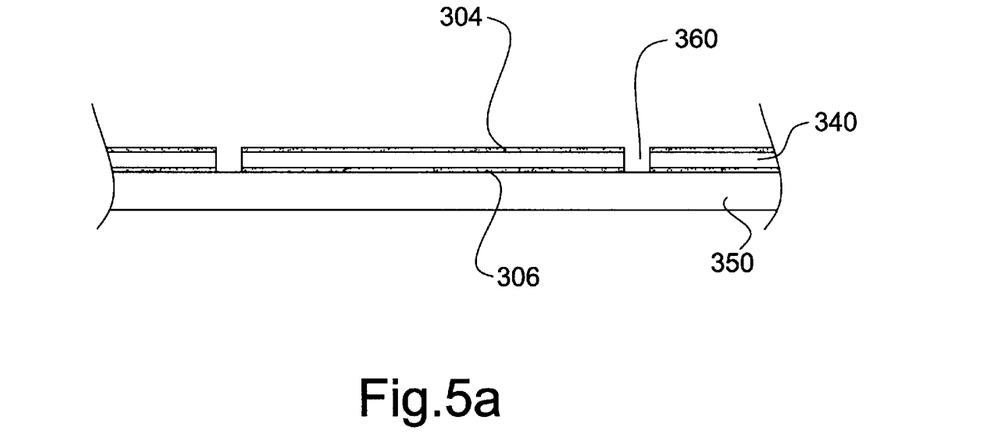
FIGS. 5a–5d illustrate a method for manufacturing a semiconductor chip package according to a first preferred embodiment of the present invention.

FIG. 5a illustrates a tape 340 securely attached onto a rigid metal plate 350. The tape 340 includes a first adhesive layer 304 on an upper surface thereof and a second adhesive layer 306 on a lower surface thereof. The tape has a plurality of holes 360. The tape is preferably made of polyimide or polyester with a layer of silicone adhesive formed thereon. Specifically, the tape is attached onto the rigid metal plate 350 through the second adhesive layer 306 so as to form a tape/plate assembly. The purpose of the tape/plate assembly is used to support the semiconductor chip during the assembly process for producing the semiconductor chip package of the present invention.

Figure 5B:
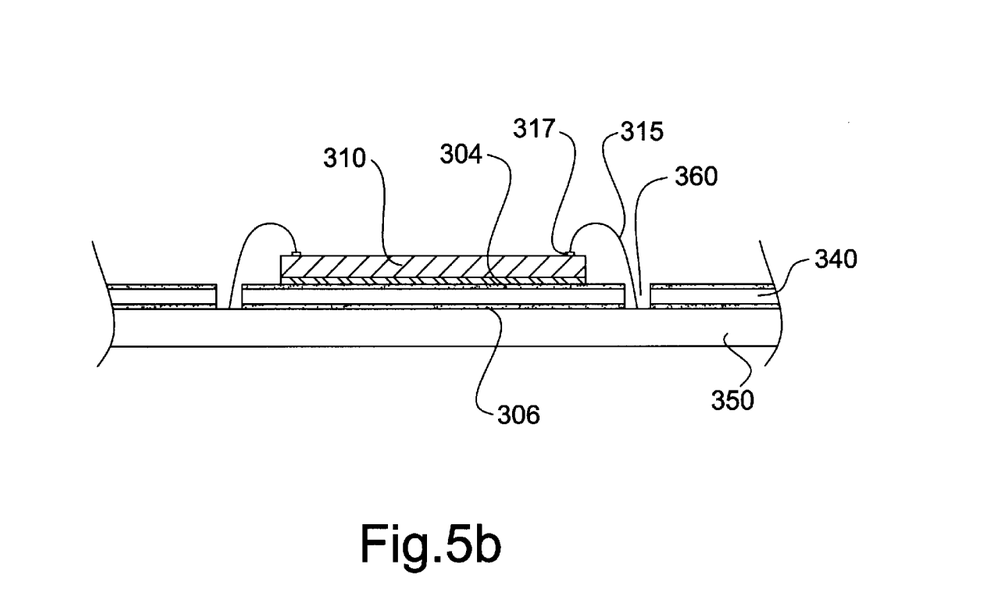

Referring to FIG. 5b, a semiconductor chip 310 is securely attached onto the tape/plate assembly by the first adhesive layer 304 on the upper surface of the tape 340. The holes 360 of the tape 340 are located at the periphery of the semiconductor chip 310. A first ends of bonding wires 315 are connected to corresponding bonding pads 317 on the semiconductor chip 310 and a second ends of the bonding wires 315 to are connected to the rigid metal plate 350 through corresponding holes 360 of the tape using known wire bonding techniques.

Figure 5C:
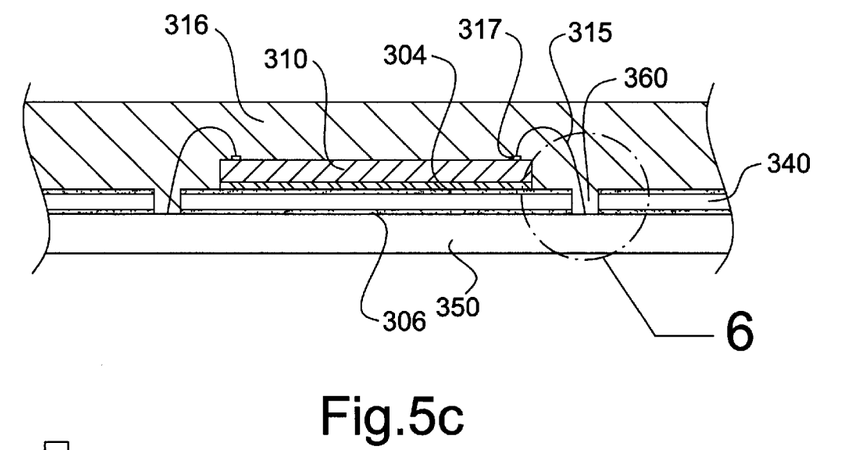

Referring to FIG. 5c, the package body 316 is formed over the semiconductor chip 310 and the bonding wires 315 against a portion of the tape/plate assembly using known plastic molding methods such as transfer molding. After the encapsulating step, a separation process is proceeded to remove the rigid metal plate 350 and the tape 340 such that the second ends of the bonding wires 315 are exposed from the package body 316. Specifically, the separation process is accomplished by peeling off the rigid metal plate 350 and the tape 340, and the semiconductor chip 310 and the second ends of the bonding wires 315 are still embedded in the package body 316 after peeling.

Figure 5D:
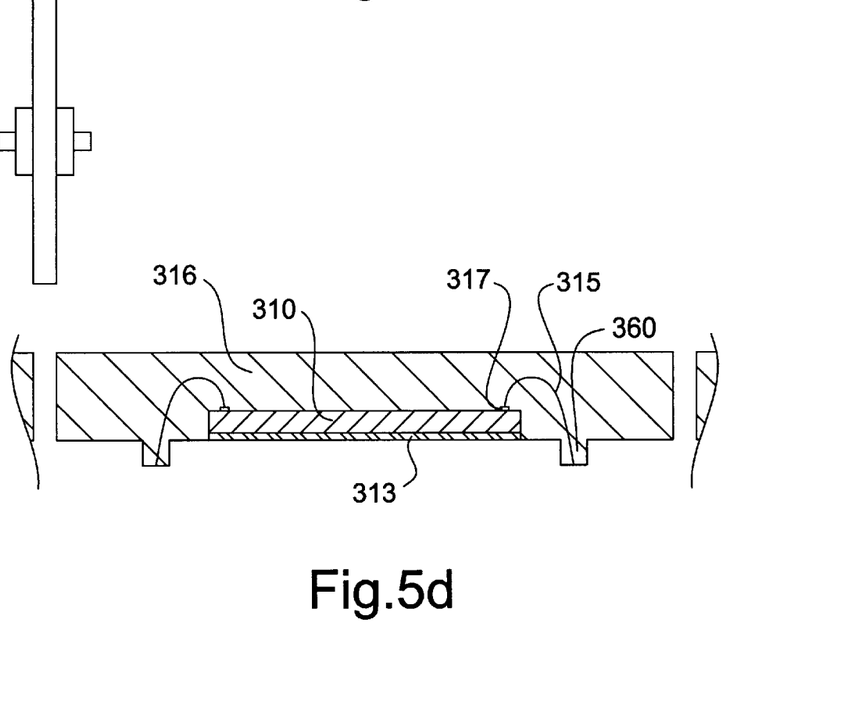

Finally, referring to FIG. 5d, a singulation step is conducted to complete the packaging process. In the singulation process, a resin-bond saw blade is used to cut the molded product into separate units along predetermined dicing lines to obtain the finished semiconductor chip package 300 as shown in FIG. 3.

Figure 6:
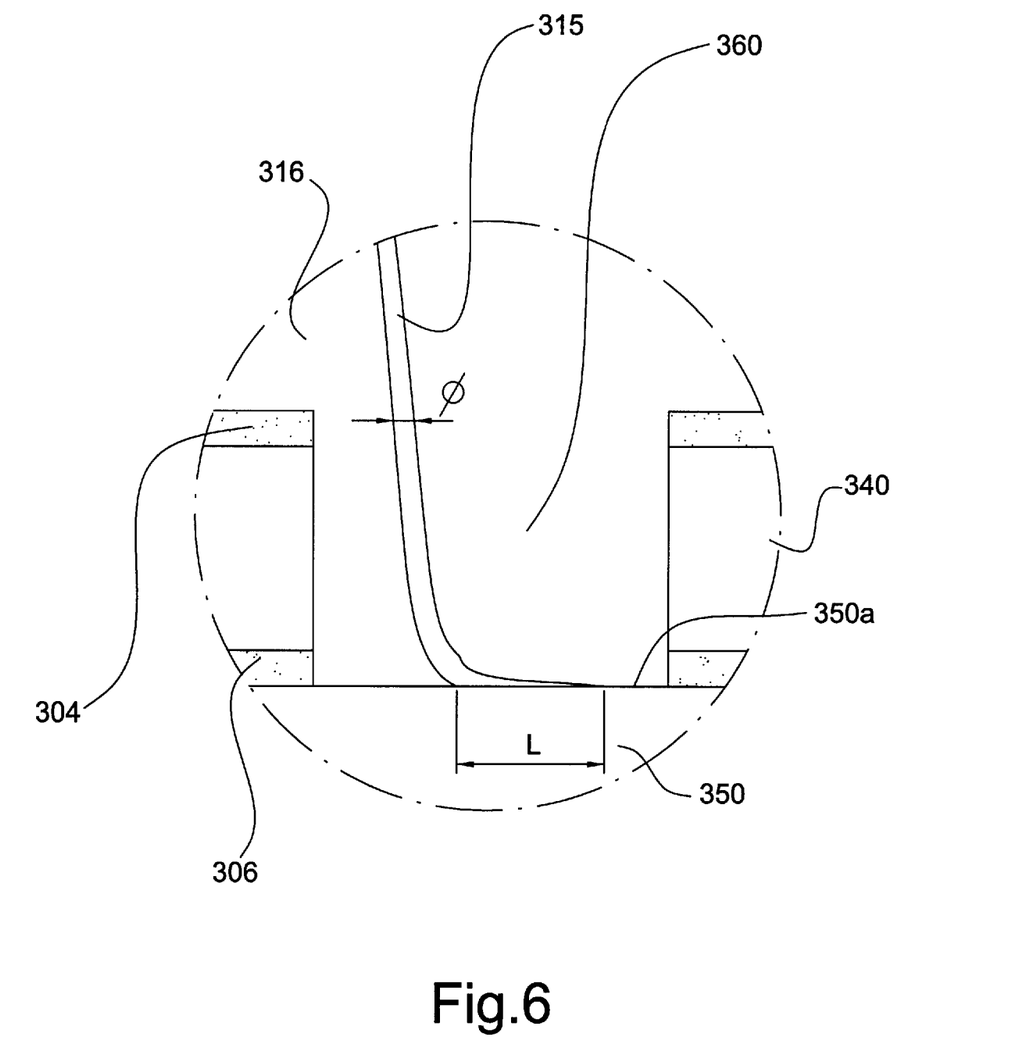
FIG. 6 is a cross sectional view showing one end of a bonding wire stitch-bonded to a rigid metal plate on an enlarged scale.
Figure 7:
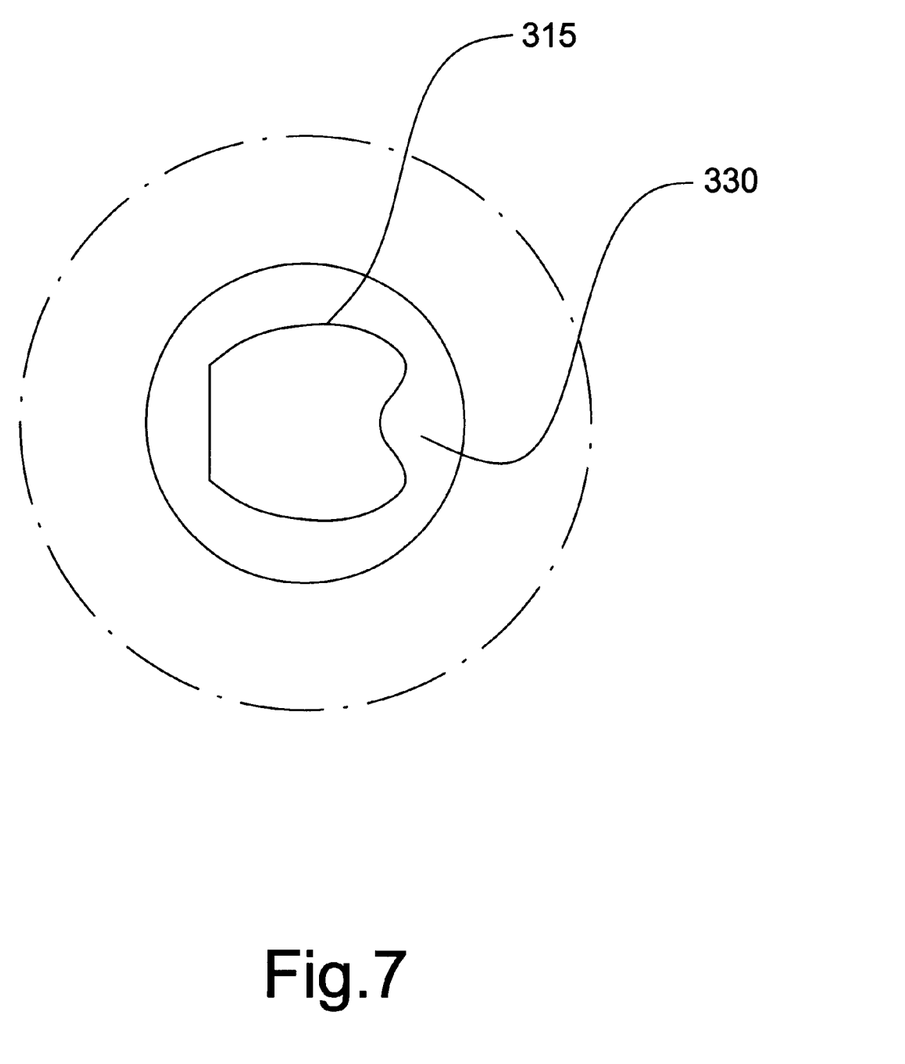
FIG. 7 is an enlarged bottom plan view of a portion of the semiconductor chip package in FIG. 4 illustrating a stitch-bonding surface with the fishtail shape exposed from one of the protruding potions of the package body.

Referring to FIG. 6, during the wire bonding operation described above, a stitch bonding is conducted to connect the second end of wire 315 to the upper surface 350a of the rigid metal plate 350 through holes 360 of the tape. It is noted that the stitch bonding length "L" is preferably at least four times larger than the diameter "φ" of the bonding wire 315. As shown in FIG. 7, after stitch bonding, the second end of the bonding wire possesses a fishtail-like shape. The exposed second end of each bonding wire has a longitudinal length at least four times larger than the diameter "φ" of the bonding wire.

Figure 8A:
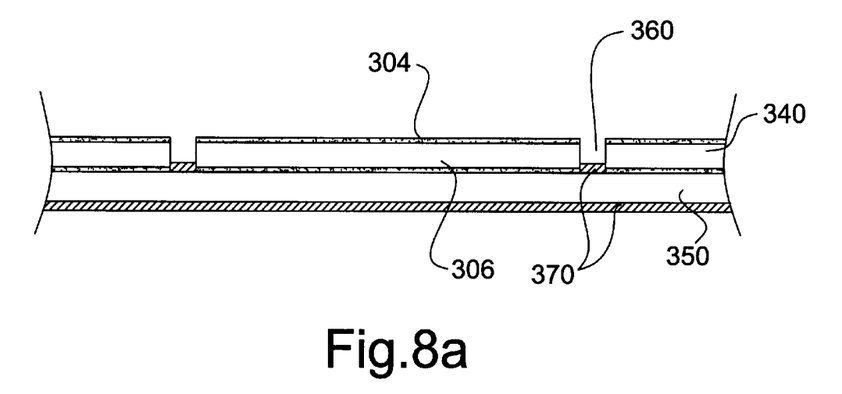
FIGS. 8a–8c illustrate a method for manufacturing a semiconductor chip package according to a second preferred embodiment of the present invention.
Figure 8B:
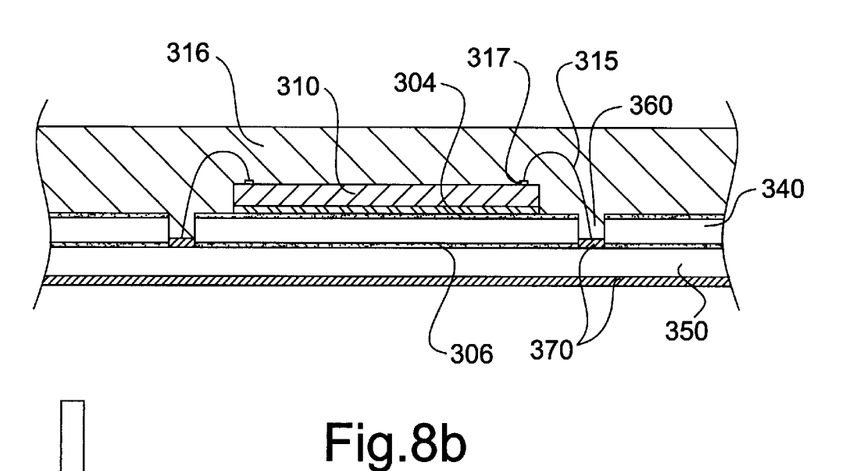
Figure 8C:
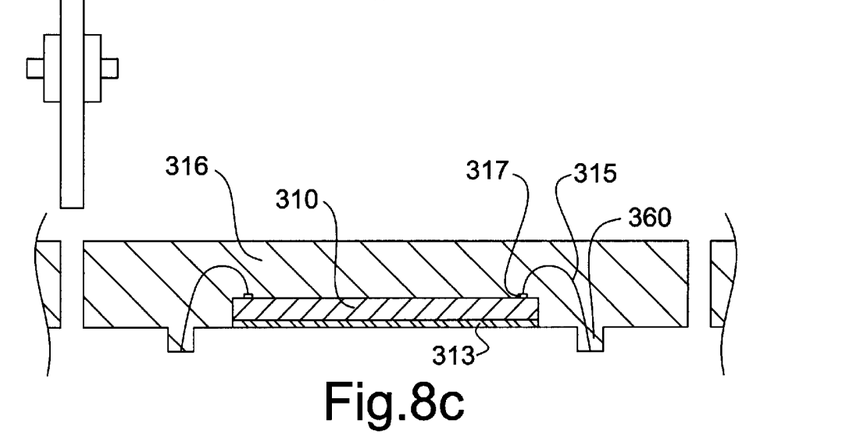

FIGS. 8a–8c illustrate a method for manufacturing a semiconductor chip package according to a second preferred embodiment of the present invention.

Referring to FIG. 8a, first, a metal flash 370 is formed on certain area of the rigid metal plate 350 which is exposed from the holes 360 of the tape 340. The tape/plate assembly of FIG. 8a is substantially the same as shown in FIG. 5a. The metal flash 370 is preferably made of metals such as gold or palladium, which allows a good bond to be formed with the conventional bonding wire material.

Referring to FIG. 8b, a semiconductor chip 310 is securely attached onto the tape/plate assembly by the first adhesive layer 304 on the upper surface of the tape 340. Then, a first ends of bonding wires 315 are connected to corresponding bonding pads 317 on the semiconductor chip 310 and a second ends of the bonding wires 315 to are connected to the metal flash 370 on the rigid metal plate 350 through corresponding holes 360 of the tape using known wire bonding techniques. After that, the package body 316 is formed over the semiconductor chip 310 and the bonding wires 315 against a portion of the tape/plate assembly using known plastic molding methods such as transfer molding. After the encapsulating step, a separation process is proceeded to remove the rigid metal plate 350, including the metal flash 370, and the tape 340, including the first adhesive layer 304 and the second adhesive layer 306 such that the second ends of the bonding wires 315 are exposed from the package body 316.

Finally, referring to FIG. 8c, a singulation step is conducted to complete the packaging process.

FIGS. 9a–9d illustrate a method for manufacturing a semiconductor chip package according to a third preferred embodiment of the present invention.

Figure 9A:
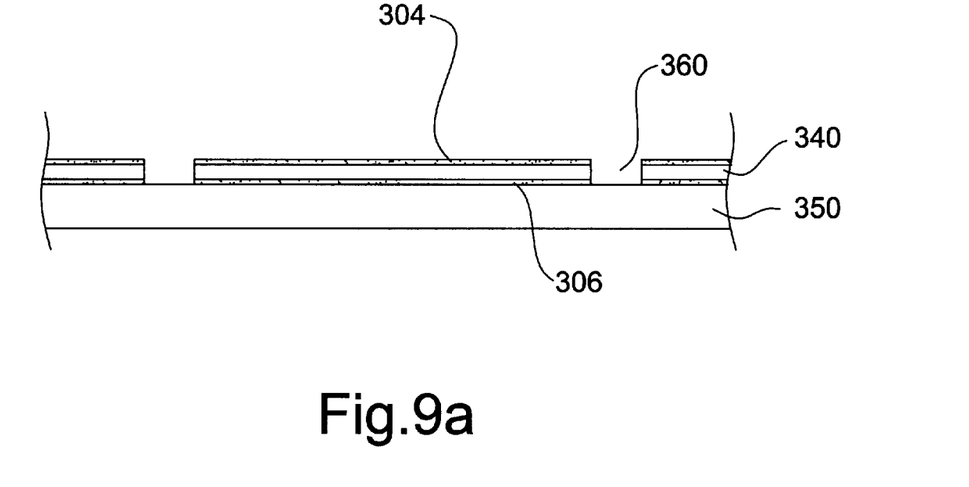
FIGS. 9a–9d illustrate a method for manufacturing a semiconductor chip package according to a third preferred embodiment of the present invention.

FIG. 9a illustrates a tape 340 securely attached onto a nonmetal rigid plate 350. The tape 340 includes a first adhesive layer 304 on an upper surface thereof and a second adhesive layer 306 on a lower surface thereof. The tape has a plurality of holes 360. The tape is preferably made of polyimide or polyester with a layer of silicone adhesive formed thereon. Specifically, the tape is attached onto the rigid metal plate 350 through the second adhesive layer 306 so as to form a tape/plate assembly.

Figure 9B:
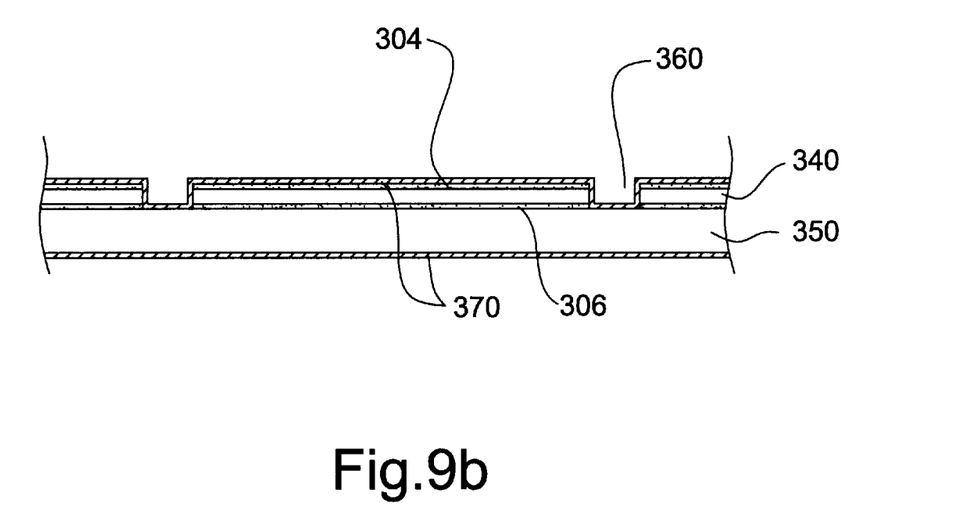

Referring to FIG. 9b, a metal flash 370 is formed over the entire surface of the tape/plate assembly by electroless plating.

Figure 9C:
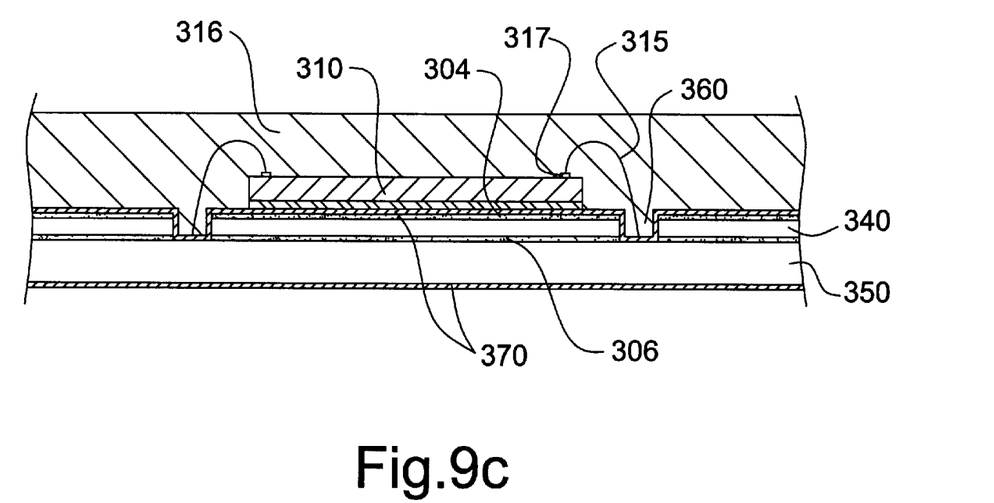

Referring to FIG. 9c, a semiconductor chip 310 is securely attached onto the metal flash 370 coated on the tape/plate assembly by a conductive or nonconductive adhesive layer such as silver paste (not shown) in a manner that the holes 360 of the tape 340 are located at the peripheral of the chip 310. Then, a first ends of bonding wires 315 are connected to corresponding bonding pads 317 on the semiconductor chip 310 and a second ends of the bonding wires 315 to are connected to the metal flash 370 coated on the nonmetal rigid plate 350 through corresponding holes 360 of the tape using known wire bonding techniques. After that, the package body 316 is formed over the semiconductor chip 310 and the bonding wires 315 against a portion of the tape/plate assembly using known plastic molding methods such as transfer molding. After the encapsulating step, a separation process is proceeded to remove the nonmetal rigid plate 350, including the metal flash 370, and the tape 340, including the first adhesive layer 304 and the second adhesive layer 306 such that the second ends of the bonding wires 315 are exposed from the package body 316.

Figure 9D:
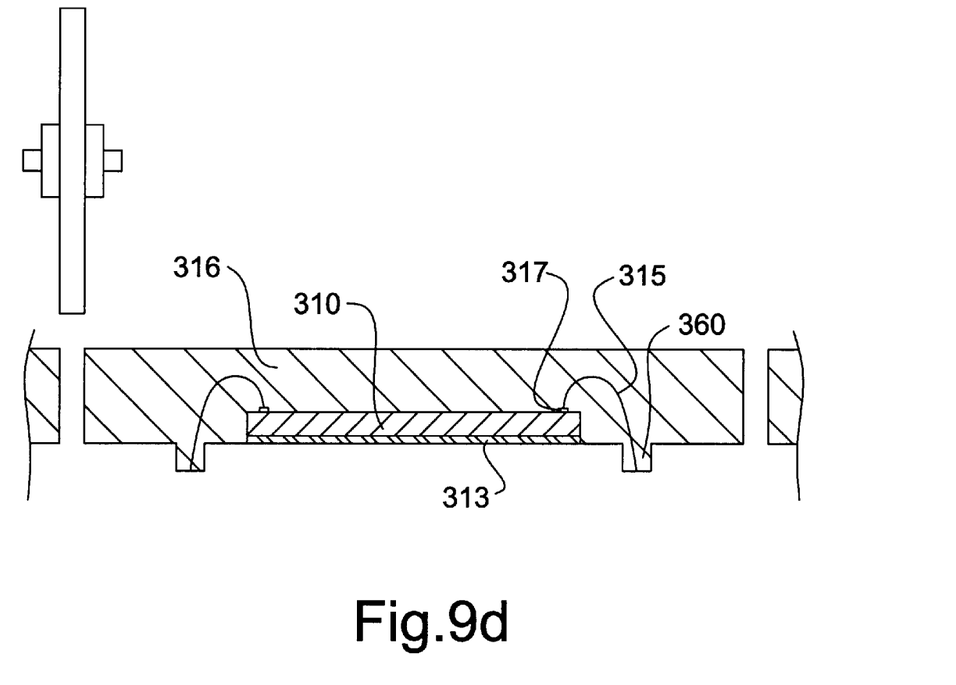

Finally, referring to FIG. 9d, a singulation step is conducted to complete the packaging process.

As described above, the present invention provides methods for packaging semiconductor chip wherein the conventional lead frame is skipped thereby significantly reducing the finished package's profile. In the semiconductor chip packages of the present invention, the metal layer 313 on the backside surface of the chip is directly exposed from the bottom surface of the package body thereby enabling a better thermal dissipation so as to extend the chip's lifetime. Furthermore, in the semiconductor packaging methods according to the first and the second embodiments, since the chip is directly attached to tape/plate assembly via the adhesive layer on the tape, the cost of die bond material can be saved.

Although the invention has been explained in relation to its preferred embodiment, it is to be understood that many other possible modifications and variations can be made without departing from the spirit and scope of the invention as hereinafter claimed.

What is claimed is:

1. A semiconductor chip package, comprising:

a semiconductor chip;

a metal layer directly formed on the backside surface of the semiconductor chip;

a package body encapsulating the chip in a manner that the metal layer on the backside surface of the chip is exposed from the bottom surface of the package body, the package body having a plurality of protruding portions projecting from the bottom surface of the package body; and a plurality of bonding wires, each of the bonding wires having one end electrically connected to the semiconductor chip and the other end exposed from one of the protruding portions of the package body.

2. The package as claimed in claim 1, wherein the bonding wire is a gold wire.

3. The package as claimed in claim 1, wherein the metal layer is formed from a metal selected from the group consisting of aluminum, copper, gold, palladium and silver.

4. The package as claimed in claim 3, wherein the metal layer is formed from gold.

5. The package as claimed in claim 1, wherein the exposed end of each bonding wire has a longitudinal length at least four times larger than the diameter of the bonding wire.

6. A semiconductor chip package, comprising:

a semiconductor chip;

a metal layer formed over the backside surface of the semiconductor chip;

a package body encapsulating the chip in a manner that the metal layer on the backside surface of the chip is exposed from the bottom surface of the package body, the package body having a plurality of protruding portions projecting from the bottom surface of the package body; and a plurality of bonding wires, each of the bonding wires having one end electrically connected to the semiconductor chip and the other end exposed from one of the protruding portions of the package body;

wherein the metal layer is in direct contact with the backside surface of the semiconductor chip.

7. The chip package of claim 7, wherein the metal layer comprises metallic particles adhered to the backside surface of the semiconductor chip.

8. The chip package of claim 7, wherein the metal layer is in direct physical and thermal contact with the backside surface of the semiconductor chip.

* * * * *